United States Patent
Somchit et al.

(10) Patent No.: US 6,772,381 B1
(45) Date of Patent: Aug. 3, 2004

(54) PROGRAMMABLE LOGIC DEVICE VERIFICATION SYSTEM AND METHOD

(75) Inventors: Piyanuch Somchit, Bangkok (TH); Precha Srisatuan, Patumtani (TH); Lersak Nudach, Nonthaburi (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 427 days.

(21) Appl. No.: 10/051,791

(22) Filed: Jan. 17, 2002

(51) Int. Cl.[7] .......................... G01R 31/28; G06F 17/50
(52) U.S. Cl. .......................... 714/725; 714/736; 716/16
(58) Field of Search ................................ 714/725, 736, 714/718, 819, 820, 734, 724; 711/100, 103, 104; 716/7, 16, 17; 365/200, 201

(56) References Cited

U.S. PATENT DOCUMENTS

| | | | | |
|---|---|---|---|---|
| 4,761,768 A | * | 8/1988 | Turner et al. | 365/185.22 |
| 5,757,815 A | * | 5/1998 | Shimogama et al. | 714/718 |
| 5,793,687 A | * | 8/1998 | Deans et al. | 365/201 |
| 5,822,257 A | * | 10/1998 | Ogawa | 365/200 |

* cited by examiner

Primary Examiner—Christine T. Tu
(74) Attorney, Agent, or Firm—Renner, Otto, Boisselle & Sklar, LLP

(57) ABSTRACT

A method and system for testing programmability of a programmable logic device (PLD) having a programmable AND array. The PLD is bulk programmed and verified. If the bulk programming fails, each row of cells of the AND array is programmed individually and the row-by-row programming of the PLD is verified.

12 Claims, 5 Drawing Sheets

PROGRAMMABLE LOGIC DEVICE VERIFICATION SYSTEM AND METHOD

TECHNICAL FIELD

The present invention generally relates to the testing and verification of integrated circuits, and more particularly to a method of verifying the operation of programmable logic devices having a sum-of-product (AND/OR) architecture.

BACKGROUND ART

Programmable logic devices (PLDs), sometimes referred to as programmable logic arrays (PLAs), used to implement complex logic functions are well known in the art. An example flash erasable reprogrammable CMOS PLD having a sum-of-product (AND/OR) gate array and programmable macrocell logic structure is sold under the designation PALCE20V8 by Advanced Micro Devices, Inc., One AMD Place, P.O. Box 3453, Sunnyvale, Calif. 94088.

For many PLDs, logic equations are programmed into the PLD through floating gate cells in an AND logic array. In the past, verification of device operation has been carried out using a parametric test known as bulk programming or bulk testing. Bulk programming generally involves programming each cell at the same time and then verifying that the device (i.e., the device under test, or DUT) did indeed become programmed as desired, thereby attempting to ensure cell storage.

However, it has recently been determined that many PLDs that fail the bulk programming verification scheme are in fact fully operational devices. In other words, bulk programming results in a fairly high false negative rate. As a result, bulk programming tests unnecessarily can lead to low product yields and/or product lots being held for further analysis.

Accordingly, there exists a need in the art for a testing routine for PLDs that reduces the number of false negative verification results.

SUMMARY OF THE INVENTION

According to one aspect of the invention, the invention is a method of testing programmability of a programmable logic device (PLD) having a programmable AND array. The method includes the steps of bulk programming a bulk test pattern across each cell of a cell matrix of the AND array; reading the bulk test pattern;

accepting the programmability test of the PLD if the read bulk test pattern matches an expected result, otherwise: programming a row-by-row test pattern across each cell of the cell matrix of the AND array one row at a time; reading the row-by-row test pattern; and accepting the programmability test of the PLD if the read row-by-row test pattern matches an expected result, and otherwise rejecting the PLD.

According to another aspect of the invention, the invention is a test apparatus for testing programmability of a programmable logic device (PLD) having a programmable AND array. The apparatus includes an interface for receiving and establishing electrical connection to contacts of the PLD; and a processor for executing logic. The logic includes logic to bulk program a bulk test pattern across each cell of a cell matrix of the AND array; logic to read the bulk test pattern; and logic to accept the programmability test of the PLD if the read bulk test pattern matches an expected result, otherwise logic to program a row-by-row test pattern across each cell of the cell matrix of the AND array one row at a time; logic to read the row-by-row test pattern; and logic to accept the programmability test of the PLD of the read row-by-row test pattern matches an expected result, and otherwise rejecting the PLD.

BRIEF DESCRIPTION OF DRAWINGS

These and further features of the present invention will be apparent with reference to the following description and drawings, wherein.

DISCLOSURE OF INVENTION

Figure 1A:
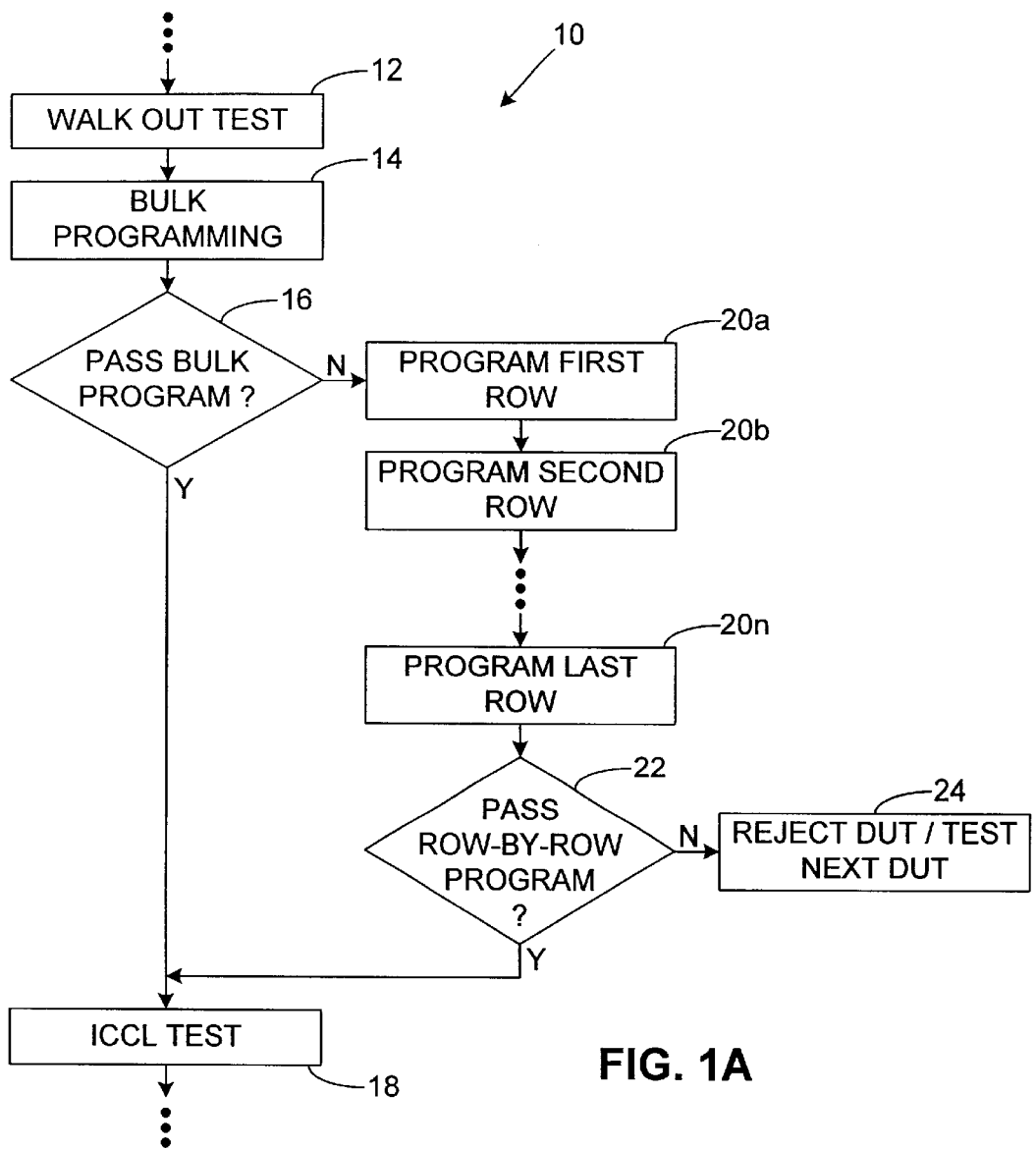
FIG. 1A is a flow chart of a verification method for a programmable logic device (PLD) according to the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

According to one aspect of the invention, a method of verifying operation of a programmable logic device (PLD), sometimes referred to as a programmable logic array (PLA), having a sum-of-product, AND/OR architecture is described. The method involves bulk programming of the PLD (i.e., programming each floating gate cell at the same time). Should verification of the bulk program fail, the method will program the PLD one row at a time and verify that the row-by-row programming was successful. Row by row programming of a device rejected by verification of a bulk program assists in ensuring programming of each array cell of the PLD and subsequent verification of the programmed row of cells.

Referring now to the figures and particularly to FIG. 1A, a flow chart of a verification method 10 for a PLD 100 (FIG. 2) according to the present invention is illustrated. The method 10, in part, is directed to testing the programmability of the PLD 100. The method 10 can be adapted to verify operation of a variety of PLDs, and particularly PLDs having a sum-of-product (AND/OR) architecture embodied as an integrated circuit for carrying out complex logic functions.

Figure 2:
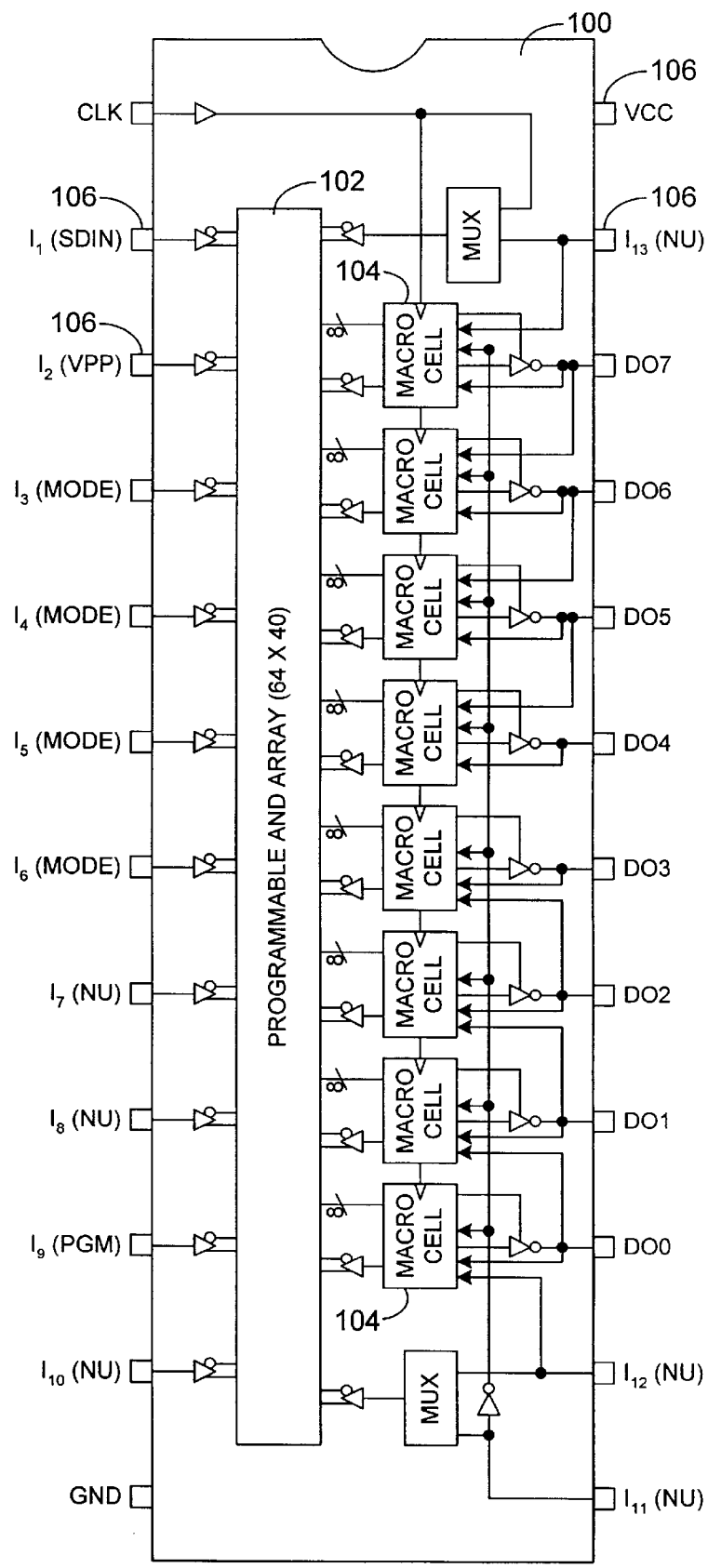
FIG. 2 is a block diagram of an exemplary PLD that can be verified by the verification method illustrated in FIG. 1.

With additional reference to FIG. 2, the illustrated example PLD 100 is a flash erasable, reprogrammable CMOS device available from Advanced Micro Devices, Inc., One AMD Place, P.O. Box 3453, Sunnyvale, Calif. 94088 under the designation PALCE20V8.

The illustrated PLD 100 is implemented with a well-known sum-of-product (AND/OR) logic structure, also referred to herein as a programmable AND logic array or AND array 102. Logic equations are programmed into the PLD 100 through a plurality of floating gate cells in the AND logic array 102. Logically, if not physically, the floating gate cells (or simply the cells) are arranged in a matrix having a series of rows and a series of columns. Programmable macrocells 104 can be used either to generate internal output enable control signals or to produce a data product term. Overall, the PLD 100 has up to twenty inputs and eight outputs. The AND array 102 has forty input terms and eight product terms per output. Each macrocell 104 has eighteen architecture bits, two of which are global bits applying to all macrocells 104. The remainder of the architecture bits apply locally. The architecture bits determine whether the macrocell 104 functions as a register or combinatorial with an inverting or noninverting output.

Figure 1B:
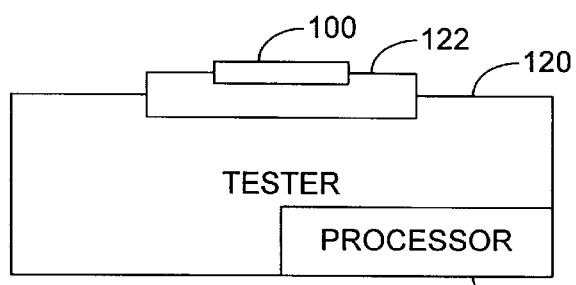
FIG. 1B is a block diagram of a test apparatus for implementing the verification method.

Referring now to FIGS. 1A and 1B, the verification method 10 includes a number of tests carried out on the PLD 100, also referred to herein as the DUT, to verify functionality and operation of the PLD 100. These tests can be part of a final test (F/T) of device operation. Prior to the commencement of method 10, the PLD 100 is placed in a test assembly 120 used to test integrated circuits. The tester 120 has a test socket 122, or other appropriate interface such as an M8K interface, for receiving and electrically connecting to pins or connectors 106 (FIG. 2) of the PLD 100. The tester 120 is controlled by a computer or processor 124 for carrying a specified logic routine, or test program, embodied in executable code. As one skilled in the art will appreciate, the method 10 can be embodied in such executable code and, if desired, stored in a computer readable medium, such as on a magnetic or optical storage component.

The tests carried out in method 10 include bulk programming of PLD 100 cells, and, if rejected during a verification step, row by row programming and verification of the PLD 100. Such testing can be inserted among other test routines, including, for example, a walk out test step 12 to check behavior of the CMOS implementing the PLD 100 (e.g., checking the reverse current-voltage characteristics of drain junction changes as a function of applied bias).

In step 14, the PLD 100 is bulk programmed, that is each floating gate cell is programmed together using a single programming step (or set of steps). A method of bulk programming the example PLD 100 PALCE20V8 is described in greater detail below. Briefly, the bulk programming step 14 includes "erasing" all cell data to logical high, or one (1). A test pattern in the cell matrix is then created by changing at least some cell data to logic low, or zero (0).

Once the test pattern is programmed in step 14, the tester will read the test pattern and verify the programming of the test pattern in step 16. Should the test pattern match an expected result, thereby indicating that the PLD 100 was successfully bulk programmed, the method 10 will continue to validate various other parameters of the PLD 100. For example, the method 10 can carry out a current consumption (ICCL) test in step 18 as is known in the art. Alternatively, the method 10 can accept the PLD 100 as operational and the PLD 100 can be transported to an accepted bin.

If the test pattern does not match the expected result in step 16, the bulk programming of the PLD 100 is considered to have failed. However, this may not mean that the PLD 100 itself is a faulty device. Without being bound by theory, it is believed that occasionally during bulk programming, insufficient current is supplied to each cell to drive the value of each cell to a desired logical state (i.e., logical high or logical low). More specifically, it is believed that there is not enough available power to be distributed to each cell at the same time.

If the bulk programming fails in step 16, the method will conduct row-by-row programming (sometimes referred to as line-by-line programming) and verification of the PLD 100 to discern whether the PLD 100 is a functional device or merely failed to become programmed through the bulk programming operation. More specifically, the method 10 will proceed to step 20 where each row of the floating gate array is individually programmed. As illustrated in FIG. 1A, a first row is programmed in step 20a, a second row is programmed in step 20b, and so forth until the last row is programmed in step 20n. A method of programming an individual row of the floating gate array is described in greater detail below. Briefly, the row programming step 20 includes "erasing" a cell data in the row to logical 1 and writing a test pattern to the row by changing at least some cells in the row to logical 0.

Once each row is programmed in steps 20a through 20n, the tester will read the overall test pattern programmed on row at a time into the PLD 100 and verify the programming of the test pattern in step 22. If the test pattern does not match an expected result in step 22, the row-by-row programming of the PLD 100 is considered to have failed and the PLD 100 will be rejected in step 24. If the PLD 100 is rejected, the PLD 100 is removed from the tester and transported to a reject bin. Thereafter, another PLD 100 to be tested can be inserted into the test socket of the tester and verified in accordance with the method 10.

If the test pattern programmed into the PLD 100 matches an expected result in step 22, thereby indicating that each row was successfully programmed, the method 10 will continue to validate various parameters of the PLD 100, such as by conducting the ICCL test in step 18, or accept the PLD 100 as operational.

Figure 3:
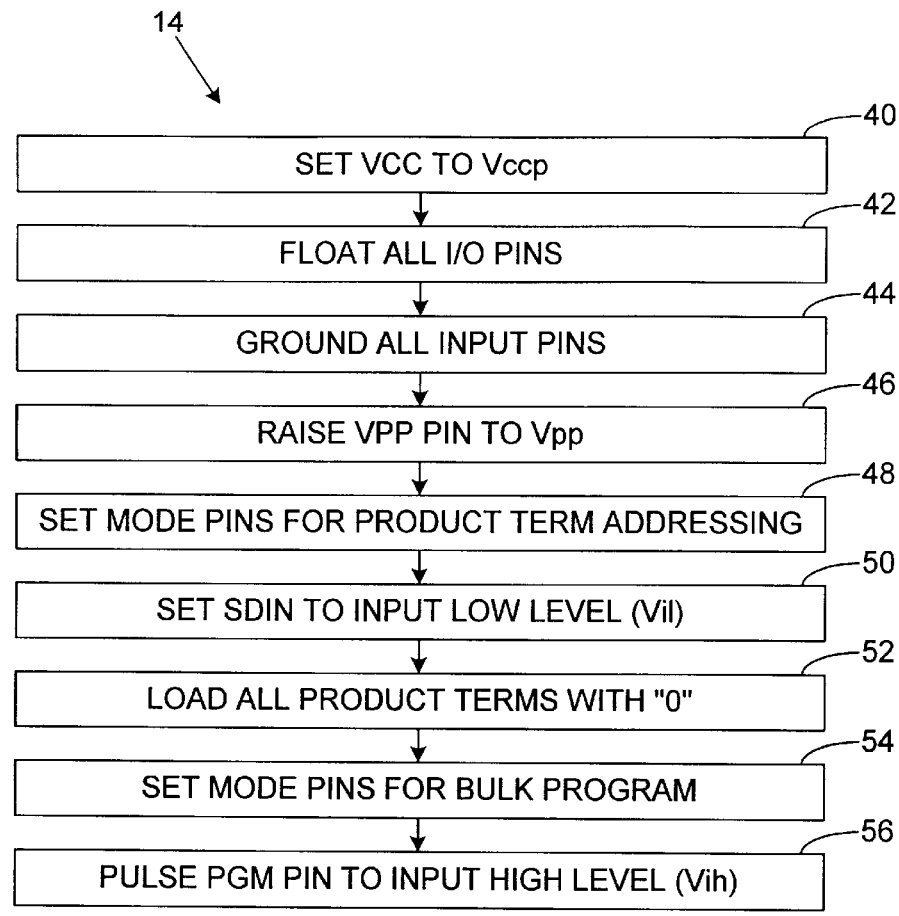
FIG. 3 is a flow chart of a bulk programming portion of the verification method.

Referring now to FIG. 3, the bulk programming step 14 is illustrated in greater detail. First, in step 40, a voltage (i.e., Vccp) is applied to a power supply pin (designated as VCC in FIG. 2) as illustrated in the signal timing diagram of FIG. 4. Next, in step 42, each input/output (I/O) pin (designed in FIG. 2 as DO0 to DO7) is allowed to float. Thereafter, in step 44, each input pin (designed in FIG. 2 as $I_1$ to $I_{13}$) is grounded. Other than grounding the input pins, $I_1$ to $I_{13}$, some of the input pins, $I_1$ to $I_{13}$, are not used by the method 10, or steps 14 or 16. These pins are designated "NU", or not used, in FIG. 2.

Figure 4:
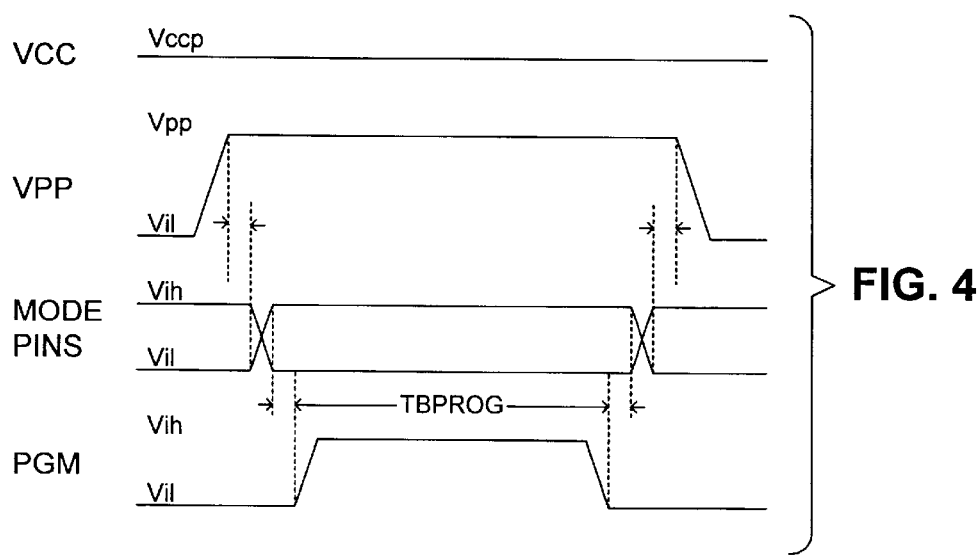
FIG. 4 is a signal timing diagram of control signals used to carry out the bulk programming portion of the verification method.

In step 46, and as illustrated in FIG. 4, input pin two ($I_2$), also referred to as a programming voltage pin (or VPP pin), is raised to a voltage of Vpp. Thereafter, in step 48, the mode pins (or input pins four through seven, $I_3$–$I_6$) are set to place the PLD 100 in a product term addressing mode. Next, a serial data in (SDIN) pin (input pin $I_1$) is set to an input low level (Vil) voltage in step 50. Next, in step 52, all product terms of the AND array 102 are loaded with a logical 0.

In step 54, and as illustrated in FIG. 4, the mode pins ($I_3$ to $I_6$) are set to place the PLD 100 in a bulk programming mode. Thereafter, a program pin (PGM, or input pin $I_9$) is pulsed for a predetermined duration (TBPROG) to an input high level (Vih) voltage in step 56.

Figure 5:
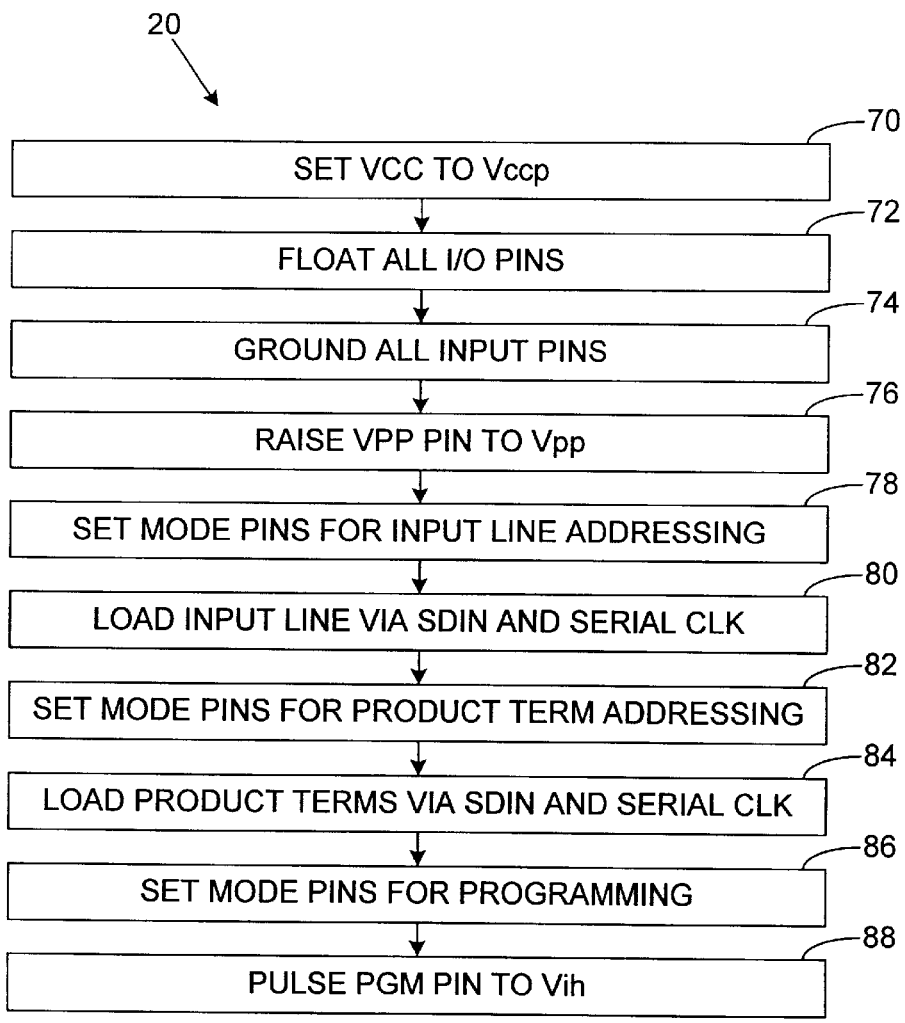
FIG. 5 is a flow chart of a row programming portion of the verification method.

Referring now to FIG. 5, the row programming step 20 is illustrated in greater detail. First, in step 70, a voltage (i.e., Vccp) is applied to the power supply pin (VCC) as illustrated in the signal timing diagram of FIG. 6. Next, in step 72, each I/O pin (DO0 to DO7) is allowed to float. Thereafter, in step 74, each input in ($I_1$ to $I_{13}$) is grounded.

Figure 6:
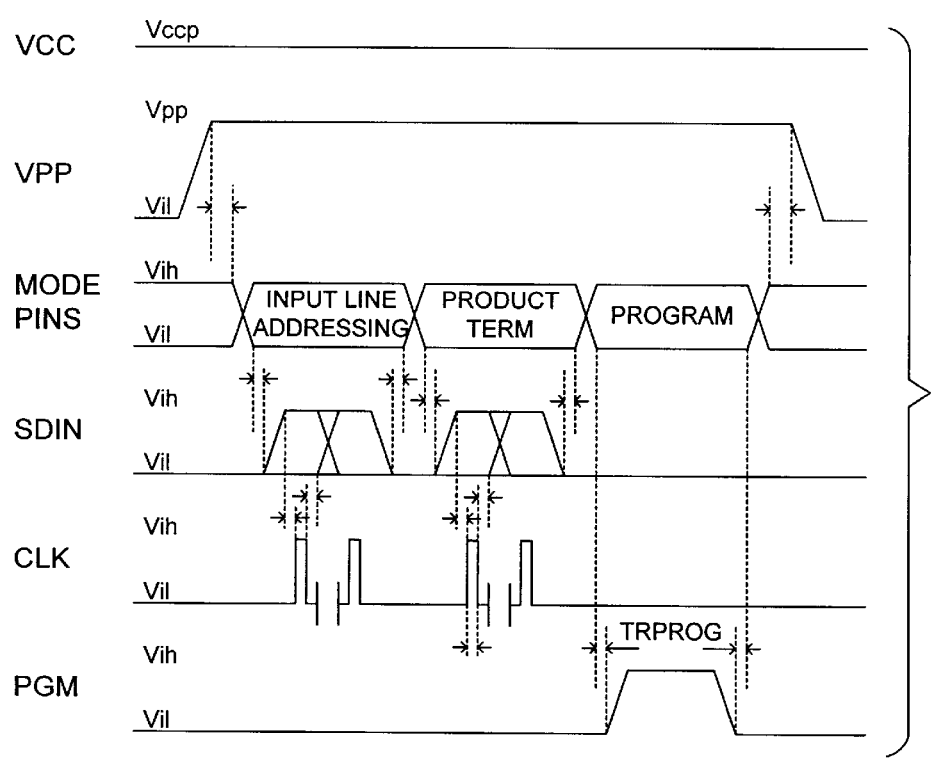
FIG. 6 is a signal timing diagram of control signals used to carry out the row programming portion of the verification method.

In step 76, and as illustrated in FIG. 6, the VPP pin is raised to a voltage of Vpp. Thereafter, in step 78, the mode pins ($I_3$–$I_6$) are set to place the PLD 100 in an input line addressing mode as illustrated in FIG. 6. Next, in step 80, an input line is loaded by appropriately pulsing the SDIN pin ($I_2$) and a clock pin (CLK) as illustrated in FIG. 6. Thereafter, in step 82, the mode pins are set to place the PLD 100 in a product term addressing mode as illustrated in FIG. 6. Next, in step 84, product terms are loaded to the desired row of the AND array 102 by appropriately pulsing the SDIN pin ($I_2$) and the clock pin (CLK) as illustrated in FIG. 6.

In step 86, the mode pins are set to place the PLD 100 in a programming mode. Thereafter, the program pin (PGM, or input pin $I_9$) is pulsed for a predetermined duration (TRPROG) to an input high level (Vih) voltage in step 88.

Although particular embodiments of the invention have been described in detail, it is understood that the invention is not limited correspondingly in scope, but includes all changes, modifications and equivalents coming within the spirit and terms of the claims appended hereto.

For example, in another embodiment of the present invention, after a row has been programmed (step 20), the programming of the row is verified before programming of the next row.

What is claimed is:

1. A method of testing programmability of a programmable logic device (PLD) having a programmable AND array, comprising the steps of:
   bulk programming a bulk test pattern across each cell of a cell matrix of the AND array;
   reading the bulk test pattern;
   accepting the programmability test of the PLD if the read bulk test pattern matches an expected result, otherwise:
     programming a row-by-row test pattern across each cell of the cell matrix of the AND array one row at a time;
     reading the row-by-row test pattern; and
     accepting the programmability test of the PLD if the read row-by-row test pattern matches an expected result, and otherwise rejecting the PLD.

2. The method according to claim 1, wherein the bulk programming step includes erasing each cell by setting each cell to the same logic value and writing the test pattern by changing at least some cells to another logic value.

3. The method according to claim 1, wherein programming a row of the AND array includes erasing each cell of the row by setting each cell of the row to the same logic value and writing to the row by changing at least some of the cells of the row to another logic value.

4. The method according to claim 1, wherein if the PLD is rejected, the PLD is removed from a testing device and a subsequent PLD is tested.

5. The method according to claim 1, further comprising a walk out test of the PLD.

6. The method according to claim 1, further comprising an input current leakage (ICCL) test of the PLD.

7. A test apparatus for testing programmability of a programmable logic device (PLD) having a programmable AND array, comprising:
   an interface for receiving and establishing electrical connection to contacts of the PLD; and
   a processor for executing logic, the logic including:
     logic to bulk program a bulk test pattern across each cell of a cell matrix of the AND array;
     logic to read the bulk test pattern;
     logic to accept the programmability test of the PLD if the read bulk test pattern matches an expected result; otherwise:
       logic to program a row-by-row test pattern across each cell of the cell matrix of the AND array one row at a time;
       logic to read the row-by-row test pattern; and
       logic to accept the programmability test of the PLD of the read row-by-row test pattern matches an expected result, and otherwise rejecting the PLD.

8. The apparatus according to claim 7, wherein the bulk programming logic includes logic to erase each cell by setting each cell to the same logic value and logic to write the test pattern by changing at least some cells to another logic value.

9. The apparatus according to claim 7, wherein the row-by-row programming logic includes logic to erase each cell of a selected row by setting each cell of the selected row to the same logic value and logic to write to the selected row by changing at least some of the cells of the selected row to another logic value.

10. The apparatus according to claim 7, wherein if the PLD is rejected, the PLD is removed from a testing device and a subsequent PLD is tested.

11. The apparatus according to claim 7, wherein the logic further includes logic to carry out a walk out test of the PLD.

12. The apparatus according to claim 7, wherein the logic further includes logic to carry out an input current leakage (ICCL) test of the PLD.

* * * * *